US011570363B2

(12) United States Patent
Wang et al.

(10) Patent No.: US 11,570,363 B2
(45) Date of Patent: Jan. 31, 2023

(54) IMAGING APPARATUS AND TERMINAL DEVICE INCLUDING ANTI-SHAKE COMPENSATION

(71) Applicant: HUAWEI TECHNOLOGIES CO., LTD., Guangdong (CN)

(72) Inventors: Wei Wang, Shenzhen (CN); Li-Te Kuo, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 17/326,515

(22) Filed: May 21, 2021

(65) Prior Publication Data

US 2021/0281761 A1 Sep. 9, 2021

Related U.S. Application Data

(63) Continuation of application No. PCT/CN2019/115852, filed on Nov. 6, 2019.

(30) Foreign Application Priority Data

Nov. 23, 2018 (CN) .......................... 201811415352.8
Dec. 1, 2018 (CN) .......................... 201811460672.5

(51) Int. Cl.
 *H04N 5/232* (2006.01)
 *H01L 27/146* (2006.01)
 (Continued)

(52) U.S. Cl.
 CPC ......... *H04N 5/23287* (2013.01); *H01L 24/72* (2013.01); *H01L 27/14618* (2013.01);
 (Continued)

(58) Field of Classification Search
 CPC ............. H04N 5/23287; H04N 5/2253; H04N 5/2257; H04N 5/2251; H04N 5/2254;
 (Continued)

(56) References Cited

U.S. PATENT DOCUMENTS 7,489,340 B2  2/2009  Koo et al.
8,035,693 B2  10/2011  Chiou et al.
(Continued)

FOREIGN PATENT DOCUMENTS

AU   2018101333 A4   10/2018
CN   101420526 B    6/2011
(Continued)

OTHER PUBLICATIONS

Extended European Search Report dated Nov. 5, 2021 issued in European Application No. 19886678.2 (18 pages).
(Continued)

*Primary Examiner* — Padma Haliyur

(57) ABSTRACT

An imaging apparatus is disclosed. The imaging apparatus includes an image sensor including includes a photosensitive region and an anti-shake module including a base, a carrier, a flexible connection member, and an actuator set. The base includes a cavity, a depth of the cavity is greater than or equal to a thickness of the image sensor, the carrier and the image sensor are disposed in the cavity, and the base provides support for the carrier by using the flexible connection member. The carrier includes a through hole, a size of the through hole is greater than or equal to that of the photosensitive region, the carrier is separately electrically connected to the image sensor and the base, and a bottom surface of the carrier is fastened to a top surface of the image sensor. Each actuator in the actuator set includes a fastened end and a movable end.

20 Claims, 10 Drawing Sheets

(51) Int. Cl.
*H01L 23/00* (2006.01)
*H02N 1/00* (2006.01)
*H04N 5/225* (2006.01)

(52) U.S. Cl.
CPC ....... *H01L 27/14636* (2013.01); *H02N 1/008* (2013.01); *H04N 5/2253* (2013.01)

(58) Field of Classification Search
CPC . H04N 5/2328; H01L 24/72; H01L 27/14618; H01L 27/14636; H02N 1/008; G02B 27/646
See application file for complete search history.

(56) References Cited

U.S. PATENT DOCUMENTS

| | | | |
|---|---|---|---|
| 8,605,160 | B2 | 12/2013 | Kwon et al. |
| 2009/0213236 | A1 | 8/2009 | Chiou et al. |
| 2015/0350500 | A1* | 12/2015 | Gutierrez ............... H05K 1/182 348/374 |
| 2016/0119517 | A1* | 4/2016 | Topliss ................. H04N 5/2253 348/374 |
| 2017/0133950 | A1 | 5/2017 | Liu et al. |
| 2019/0141248 | A1* | 5/2019 | Hubert ................... G03B 13/36 |
| 2020/0196447 | A1* | 6/2020 | Mak ....................... H05K 1/189 |

FOREIGN PATENT DOCUMENTS

| | | |
|---|---|---|
| CN | 204903924 U | 12/2015 |
| CN | 106684107 A | 5/2017 |
| CN | 106791289 A | 5/2017 |
| CN | 107277307 A | 10/2017 |
| CN | 107948532 A | 4/2018 |
| CN | 108174077 A | 6/2018 |
| CN | 108602663 A | 9/2018 |
| WO | WO-2017156462 A1 * | 9/2017 ........... G02B 27/646 |

OTHER PUBLICATIONS

Notice of Allowance dated Dec. 24, 2020 issued in Chinese Application No. 201811460672.5 (5 pages).

International Search Report dated Jan. 2, 2020 issued in PCT/CN2019/115852 (5 pages).

* cited by examiner

IMAGING APPARATUS AND TERMINAL DEVICE INCLUDING ANTI-SHAKE COMPENSATION

CROSS-REFERENCE OF RELATED APPLICATIONS

This application is a continuation of International Application No. PCT/CN2019/115852, filed on Nov. 6, 2019, which claims priority to Chinese Patent Application No. 201811415352.8, filed on Nov. 23, 2018 and Chinese Patent Application No. 201811460672.5, filed on Dec. 1, 2018. The disclosures of the aforementioned applications are hereby incorporated by reference in their entireties.

TECHNICAL FIELD

This application relates to the field of photographing technologies, and in particular, to an imaging apparatus and a terminal device.

BACKGROUND

When a camera module of a mobile phone is stable, a clear image of a photographed object can be obtained on an image sensor. However, in a photographing process, the camera module of the mobile phone shakes due to hand trembling. As a result, an image presented by the photographed object on the image sensor is deviated. Consequently, a shot image is blurred.

In an optical image stabilization (OIS) technology, an optical method such as moving a lens group or moving an image sensor may be used to suppress imaging blur caused by hand trembling, to improve photographing quality of a camera module of a mobile phone. In the prior art, an optical image stabilizer is provided, including a fastened base and a movable carrier. The movable carrier may be pushed by an actuator, to drive an image sensor on the movable carrier to generate displacement.

However, in the technical solution, the image sensor is directly stacked on the optical image stabilizer. When a lens group remains unchanged in a camera module, a height of an imaging surface of the image sensor is raised. To be specific, a distance between the lens group and the imaging surface is shortened. To maintain an original imaging effect, the distance between the lens group and the imaging surface needs to be lengthened. This additionally causes an increase in an overall height of the camera module.

SUMMARY

Embodiments of this application provide an imaging apparatus and a terminal device. An image sensor may move on a plane on which the image sensor is located, to implement anti-shake compensation. Moreover, a height of an imaging surface of the image sensor is not raised, so that the imaging apparatus can be made thinner on the basis of having an anti-shake function.

According to a first aspect, an embodiment of this application provides an imaging apparatus. The imaging apparatus includes an image sensor and an anti-shake module, where the image sensor includes a photosensitive region, the photosensitive region is disposed on a top surface of the image sensor, and the anti-shake module includes a base, a carrier, a flexible connection member, and an actuator set; the base includes a cavity, a depth of the cavity is greater than or equal to a thickness of the image sensor, the carrier is disposed in the cavity, the base provides support for the carrier by using the flexible connection member, and a quantity of flexible connection members is greater than or equal to 1;

the carrier includes a through hole, a size of the through hole is greater than or equal to that of the photosensitive region, the carrier is separately electrically connected to the image sensor and the base, a bottom surface of the carrier is fastened to the top surface of the image sensor, and the image sensor is disposed in the cavity;

the actuator set includes at least a first actuator, a second actuator, a third actuator, and a fourth actuator, the first actuator and the second actuator are disposed along a first coordinate axis, the third actuator and the fourth actuator are disposed along a second coordinate axis, the first coordinate axis and the second coordinate axis are on a same plane, an included angle between the first coordinate axis and the second coordinate axis is 90 degrees, and each actuator in the actuator set includes a fastened end and a movable end; and the fastened end of each actuator in the actuator set is connected to the base, and the movable end of each actuator in the actuator set moves close to or away from the base, to drive the carrier to move, and drive the image sensor to move.

In this implementation, the image sensor may move on the plane on which the image sensor is located, to implement anti-shake compensation. Moreover, the image sensor and the carrier are disposed in the cavity of the base, and the depth of the cavity is greater than or equal to the thickness of the image sensor. Therefore, the height of the imaging surface of the image sensor is not raised, so that the imaging apparatus can be made thinner on the basis of having an anti-shake function.

Optionally, in some implementations, the image sensor further includes a pad, the pad is disposed on the top surface of the image sensor, and a quantity of pads is greater than or equal to 1. The carrier further includes a first top-side pad, the first top-side pad is disposed on a top surface of the carrier, and the first top-side pad is electrically connected to the pad. A quantity of first top-side pads is greater than or equal to 1. In this implementation, an implementation of implementing an electrical connection between the image sensor and the carrier is provided, to lead out a signal of the image sensor to the carrier, thereby improving practicability of this solution.

Optionally, in some possible implementations, the carrier further includes a first conductive through hole and a first bottom-side pad. The first bottom-side pad is disposed on the bottom surface of the carrier. The first conductive through hole is used for connecting the first top-side pad to the first bottom-side pad. The first bottom-side pad and the pad are soldered together. A quantity of first conductive through holes and a quantity of first bottom-side pads are both greater than or equal to 1. In this implementation, an implementation of implementing an electrical connection between the pad on the top surface of the carrier and the pad of the image sensor is provided. A wire bonding operation between the carrier and the image sensor does not need to be performed, to avoid impact of a wire bonding process on devices, thereby reducing a possibility of damaging the devices.

Optionally, in some possible implementations, the first top-side pad is electrically connected to the pad through wire bonding, and the bottom surface of the carrier is bonded to the top surface of the image sensor. In this implementation, another implementation of implementing an electrical connection between the pad on the top surface of the carrier and the pad of the image sensor is provided, to improve flexibility of this solution.

Optionally, in some possible implementations, the base further includes a second top-side pad, the second top-side pad is disposed on a top surface of the base. The first top-side pad is electrically connected to the second top-side pad by using the flexible connection member, and a quantity of second top-side pads is greater than or equal to 1. In this implementation, a manner of implementing an electrical connection between the carrier and the base is provided, so that a signal of the image sensor can be led out to the base by using the carrier, thereby further improving practicability of this solution.

Optionally, in some possible implementations, the imaging apparatus further includes a printed circuit board PCB, and the PCB is fastened to a bottom surface of the base. The base further includes a second conductive through hole and a second bottom-side pad. The second bottom-side pad is disposed on the bottom surface of the base. The second conductive through hole is used for connecting the second top-side pad to the second bottom-side pad. The second bottom-side pad and the PCB are soldered together. A quantity of second conductive through holes and a quantity of second bottom-side pads are both greater than or equal to 1. In this implementation, an implementation of implementing an electrical connection between the pad on the top surface of the base and the PCB is provided, so that a signal of the image sensor can be further led out to the PCB. Moreover, a wire bonding operation between the base and the PCB does not need to be performed, to avoid impact of a wire bonding process on devices, thereby reducing a possibility of damaging the devices.

Optionally, in some possible implementations, the imaging apparatus further includes a PCB, and the PCB is fastened to a bottom surface of the base. The second top-side pad is electrically connected to the PCB through wire bonding. In this implementation, another implementation of implementing an electrical connection between the pad on the top surface of the base and the PCB is provided, to improve flexibility of this solution.

Optionally, in some possible implementations, the imaging apparatus further includes a cantilever beam set, and the cantilever beam set includes at least a first cantilever beam, a second cantilever beam, a third cantilever beam, and a fourth cantilever beam. The first cantilever beam and the second cantilever beam are disposed along the first coordinate axis. The third cantilever beam and the fourth cantilever beam are disposed along the second coordinate axis. A movable end of the first actuator is connected to the carrier by using the first cantilever beam. A movable end of the second actuator is connected to the carrier by using the second cantilever beam. A movable end of the third actuator is connected to the carrier by using the third cantilever beam. A movable end of the fourth actuator is connected to the carrier by using the fourth cantilever beam. In this implementation, an implementation of driving, by the actuators, the carrier and the image sensor to move by using the cantilever beams is provided, to improve practicability of this solution.

Optionally, in some possible implementations, one end of the flexible connection member is connected to the base, and the other end of the flexible connection member is connected to the carrier. Alternatively, one end of the flexible connection member is connected to the base, and the other end of the flexible connection member is connected to at least one cantilever beam in the cantilever beam set. Alternatively, one end of the flexible connection member is connected to the base, and the other end of the flexible connection member is connected to the movable end of at least one actuator in the actuator set. In this implementation, a plurality of specific connection manners of the flexible connection member are provided, to improve flexibility of this solution.

Optionally, in some possible implementations, the fastened end and the movable end of each actuator in the actuator set are both of an electrostatic comb-type structure. In this implementation, a specific structure of an actuator is provided, to improve practicability of this solution.

Optionally, in some possible implementations, the first actuator and the second actuator move toward a same direction, and drive the carrier and the image sensor to move along the first coordinate axis. In this implementation, the image sensor may move along the first coordinate axis, to implement an anti-shake function in a direction of the first coordinate axis.

Optionally, in some possible implementations, the third actuator and the fourth actuator move toward a same direction, and drive the carrier and the image sensor to move along the second coordinate axis. In this implementation, the image sensor may move along the second coordinate axis, to implement an anti-shake function in a direction of the second coordinate axis.

Optionally, in some possible implementations, the first actuator and the second actuator move toward opposite directions, and/or the third actuator and the fourth actuator move toward opposite directions, and drive the carrier and the image sensor to respectively rotate on corresponding planes. In this implementation, the image sensor may alternatively rotate on a plane on which the image sensor is located, to implement an anti-shake function in a direction of a Roll axis.

According to a second aspect, an embodiment of this application provides a terminal device, where the terminal device includes a processor, a controller, a memory, a bus, and an imaging apparatus; the processor, the controller, the memory, and the imaging apparatus are connected to each other by using the bus; the memory is configured to store a program and an instruction, the processor is configured to invoke the program and the instruction stored in the memory, and the processor is further configured to control the imaging apparatus by using the controller;

the imaging apparatus includes an image sensor and an anti-shake module, where the image sensor includes a photosensitive region, disposed on a top surface of the image sensor, and the anti-shake module includes a base, a carrier, a flexible connection member, and an actuator set;

the base includes a cavity, a depth of the cavity is greater than or equal to a thickness of the image sensor, the carrier is disposed in the cavity, the base provides support for the carrier by using the flexible connection member, and a quantity of flexible connection members is greater than or equal to 1;

the carrier includes a through hole, a size of the through hole is greater than or equal to that of the photosensitive region, the carrier is separately electrically connected to the image sensor and the base, a bottom surface of the carrier is fastened to the top surface of the image sensor, and the image sensor is disposed in the cavity;

the actuator set includes at least a first actuator, a second actuator, a third actuator, and a fourth actuator, the first actuator and the second actuator are disposed along a first coordinate axis, the third actuator and the fourth actuator are disposed along a second coordinate axis, the first coordinate axis and the second coordinate axis are on a sample plane, and an included angle between the first coordinate axis and the second coordinate axis is 90 degrees, and each actuator in the actuator set includes a fastened end and a movable end; and the fastened end of each actuator in the actuator set is connected to the base, and the movable end of each actuator in the actuator set moves close to or away from the base, to drive the carrier to move, and drive the image sensor to move.

DESCRIPTION OF EMBODIMENTS

Embodiments of this application provide an imaging apparatus and a terminal device. An image sensor may move on a plane on which the image sensor is located, to implement anti-shake compensation. Moreover, a height of an imaging surface of the image sensor is not raised, so that the imaging apparatus can be made thinner on the basis of having an anti-shake function.

In the specification, claims, and accompanying drawings of this application, the terms "first", "second", "third", "fourth", and so on (if existent) are intended to distinguish between similar objects but do not necessarily indicate a specific order or sequence. It should be understood that the data termed in such a way are interchangeable in proper circumstances so that the embodiments described herein can be implemented in other orders than the order illustrated or described herein. Moreover, the terms "include", "contain", and any variants thereof mean to cover the non-exclusive inclusion. For example, a process, method, system, product, or device that includes a list of steps or units is not necessarily limited to those expressly listed steps or units, but may include other steps or units not expressly listed or inherent to such a process, method, product, or device.

The embodiments of this application may be applied to a camera including an imaging apparatus. The camera may be integrated on the terminal device. The terminal device may be specifically a user device having a photographing function, such as a mobile phone, a tablet computer, a wearable device, an augmented reality (AR)/virtual reality (VR) device, a notebook computer, an ultra-mobile personal computer (UMPC), a netbook, or a personal digital assistant (PDA). This is not limited in the embodiments of this application.

When a camera is stable, a clear image of a photographed object can be obtained on an image sensor. However, in a photographing process, the camera shakes due to hand trembling. As a result, an image presented by the photographed object on the image sensor is deviated. Consequently, a shot image is blurred. In an optical image stabilization (OIS) technology, an optical method such as moving a lens group or moving an image sensor may be used to suppress imaging blur caused by hand trembling, to improve photographing quality of a camera module of a mobile phone. In OIS in which the lens group is moved, the lens group is driven by using a driving apparatus such as an actuator or a motor, to move toward a direction opposite to shake of the camera, to implement an anti-shake function. In OIS of the image sensor, the image sensor is driven by using a driving apparatus such as an actuator or a motor, to move toward a direction opposite to shake of the camera, to implement an anti-shake function.

Figure 1:
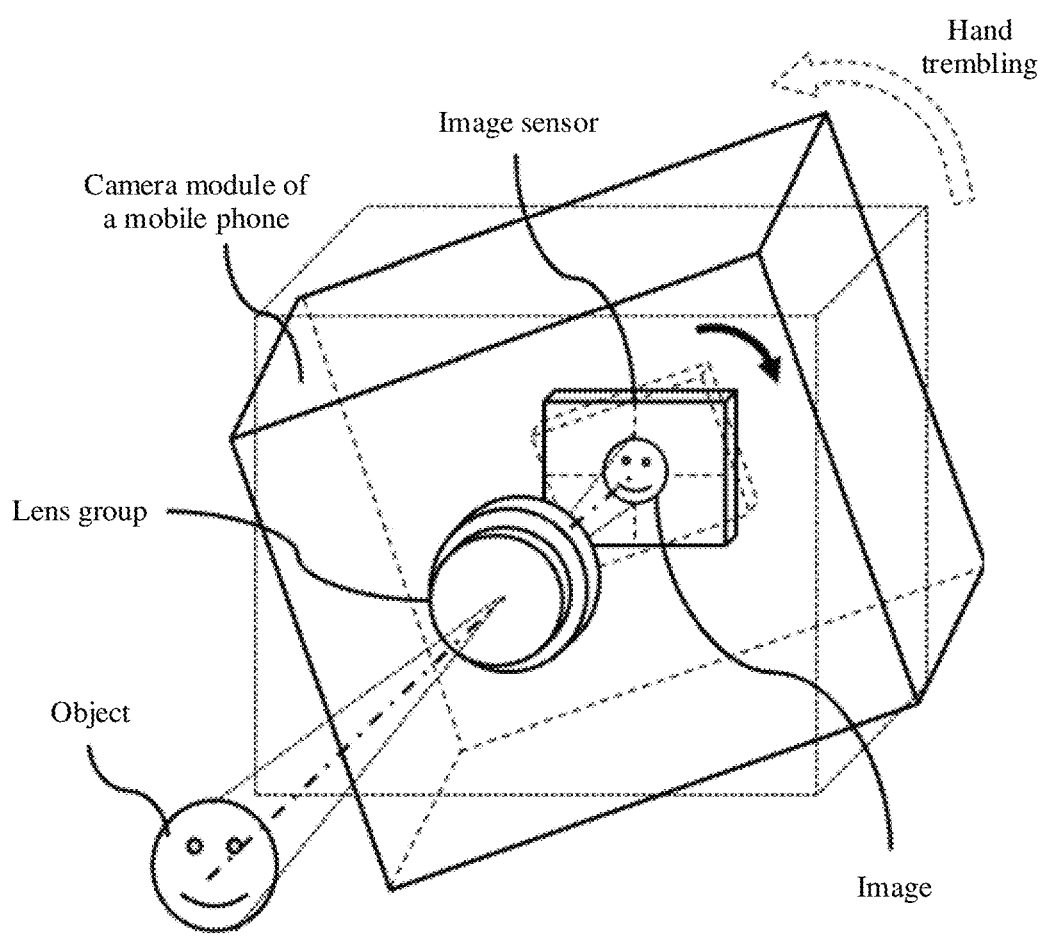
FIG. 1 is a schematic diagram of shake of a camera on a Roll axis.

To enable the camera to implement hand trembling compensation in directions of five axes: X, Y, Pitch, Yaw, and Roll, it is insufficient to use only the OIS technology of moving the lens group. FIG. 1 is a schematic diagram of shake of a camera on a Roll axis. It can be learned that, if compensation for shake is to be performed on the Roll axis, rotating the lens group does not work, and the anti-shake function on the Roll axis can be implemented only through rotation of the image sensor. Therefore, it is indispensable to use the OIS technology of the image sensor on the camera.

Figure 2:
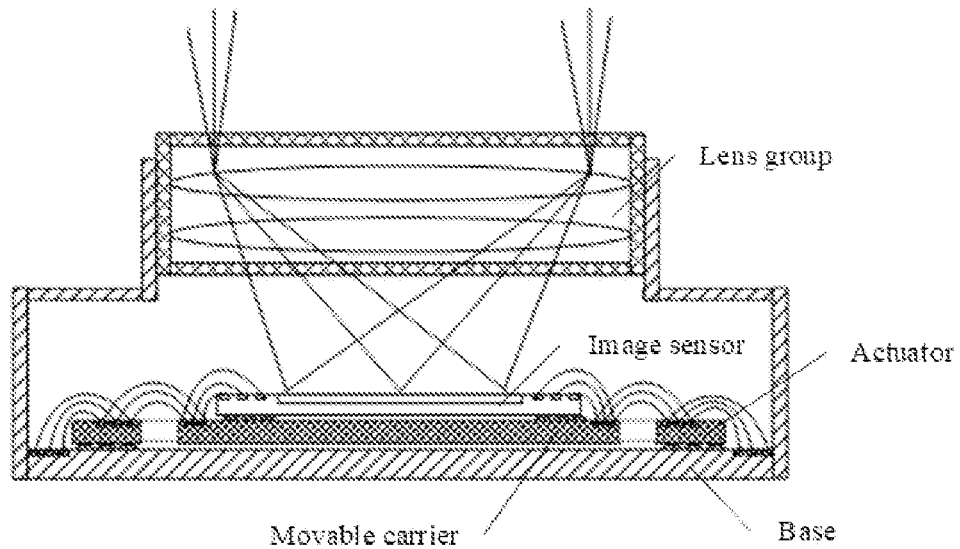
FIG. 2 is a schematic structural diagram of an anti-shake camera in a solution in the prior art.

To implement the OIS technology of the image sensor, refer to FIG. 2. FIG. 2 is a schematic structural diagram of an anti-shake camera in a solution in the prior art. A structure of the camera usually includes a lens group, a base, an actuator, a movable carrier, and an image sensor disposed on the carrier. The movable carrier may be pushed by the actuator, to drive the image sensor on the movable carrier to generate displacement. However, in the technical solution, the carrier and the image sensor are both stacked on the base. Therefore, when a distance between the base and the lens group remains unchanged, a height of an imaging surface of the image sensor is raised. To be specific, a distance between the lens group and the imaging surface is shortened. To maintain an original imaging effect, the distance between the lens group and the imaging surface needs to be lengthened. This additionally causes an increase in an overall height of a camera module. Based on a trend that current user equipment capable of photographing develops towards a direction of being lighter and thinner, it is difficult to accept this disadvantage.

Therefore, this application provides an imaging apparatus, which can be made thinner on the basis of having an anti-shake function.

Figure 3:
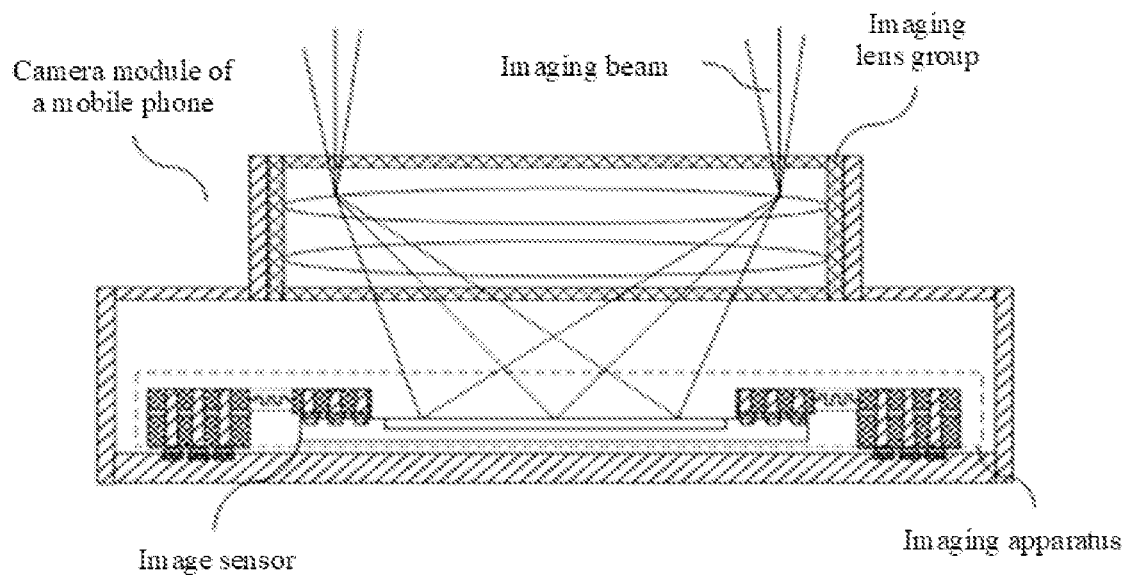
FIG. 3 is a schematic diagram of imaging of an imaging beam on an image sensor through an imaging lens group.

FIG. 3 is a schematic diagram of imaging of an imaging beam on an image sensor through an imaging lens group. FIG. 3 makes illustration by using a camera module of a mobile phone as an example. It should be noted that, the imaging apparatus in this embodiment of this application may be a complete camera module of a mobile phone shown in FIG. 3, in other words, include an imaging lens group and an imaging apparatus shown in FIG. 3. The imaging apparatus further includes an image sensor. In addition, because this application is mainly based on improvement of an OIS technology of an image sensor, the imaging apparatus in this embodiment of this application may alternatively not include the imaging lens group. This is not specifically limited herein.

The following describes a specific structure of the imaging apparatus in the embodiments of this application with reference to accompanying drawings.

Figure 4:
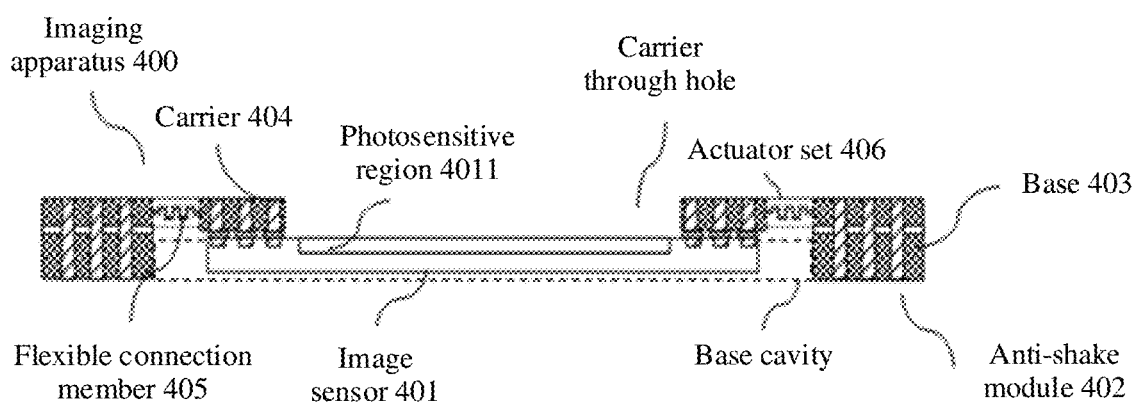
FIG. 4 is a schematic cross-sectional structural diagram of an imaging apparatus according to an embodiment of this application.

FIG. 4 is a schematic cross-sectional structural diagram of an imaging apparatus according to an embodiment of this application. The imaging apparatus 400 includes an image sensor 401 and an anti-shake module 402. A photosensitive region 4011 is disposed on a top surface of the image sensor 401. The anti-shake module 402 includes a base 403, a carrier 404, a flexible connection member 405, and an actuator set 406.

The base includes a cavity, and the carrier and the image sensor are both disposed in the cavity. To prevent a height of an imaging surface of the image sensor from being raised, a depth of the cavity is greater than or equal to a thickness of the image sensor. Because the carrier is disposed in the cavity in a suspending manner, the base provides support for the carrier by using at least one flexible connection member. It should be noted that, because actuators in this embodiment of this application will push or pull the carrier, and drive the image sensor to move, the flexible connection member needs to be used to provide support for the carrier. To be specific, a connection manner in which axial telescopic movement and bending and generation of specific displacement in a direction perpendicular to an axial direction are allowed at a connection part is used.

A bottom surface of the carrier is fastened to a top surface of the image sensor, so that movement of the carrier can drive the image sensor to move. The carrier is further separately electrically connected to the image sensor and the base, so that a signal of the image sensor can be led out to the base. In addition, the carrier includes a through hole. A size of the through hole is greater than or equal to that of the photosensitive region of the image sensor. In other words, the carrier does not block the photosensitive region in receiving an imaging beam.

The following describes the actuator set in the imaging apparatus.

Figure 5:
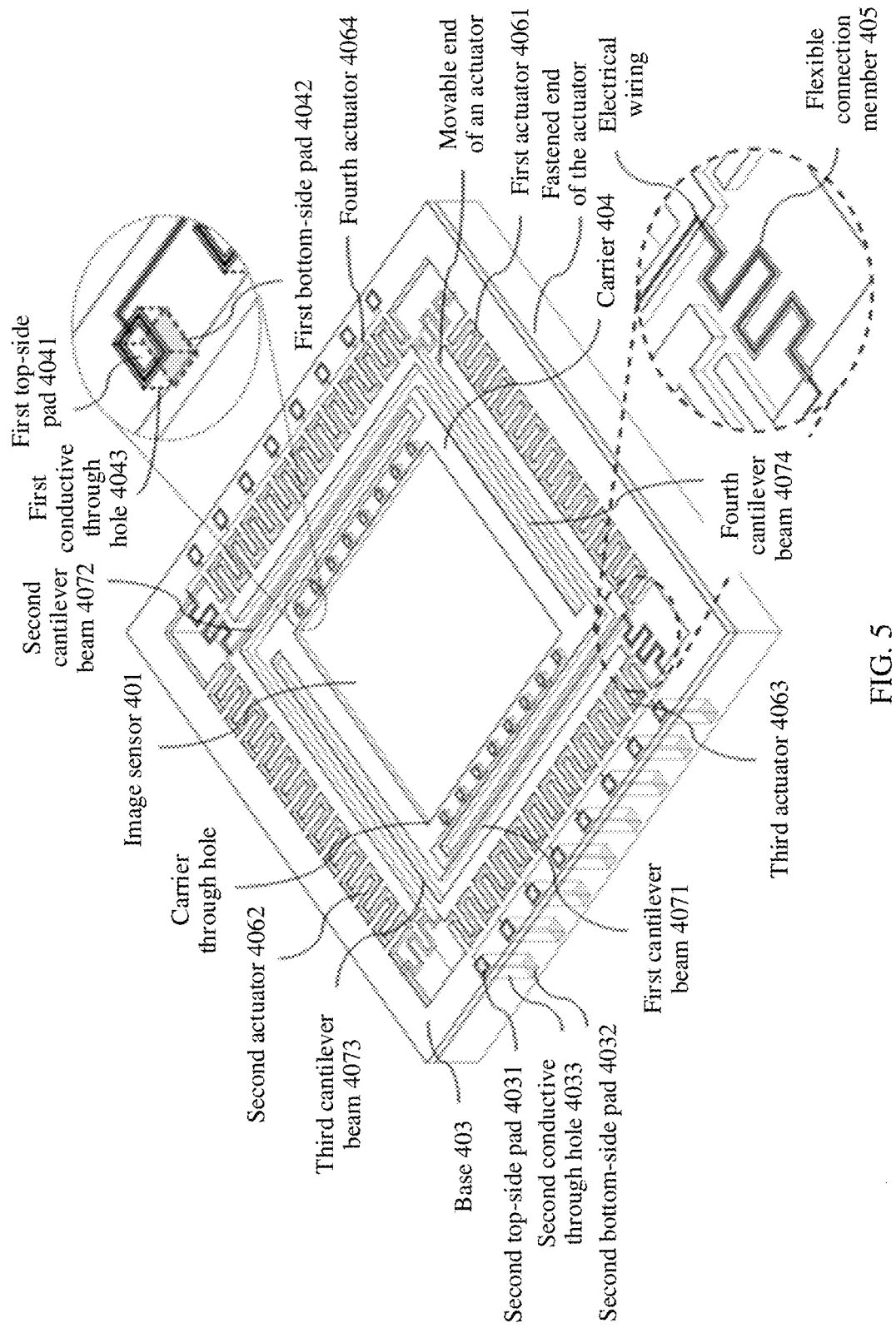
FIG. 5 is a schematic diagram of a top-side three-dimensional structure of an imaging apparatus according to an embodiment of this application.

FIG. 5 is a schematic diagram of a top-side three-dimensional structure of an imaging apparatus according to an embodiment of this application. The actuator set includes at least a first actuator 4061, a second actuator 4062, a third actuator 4063, and a fourth actuator 4064. The first actuator and the second actuator are disposed along a first coordinate axis. The third actuator and the fourth actuator are disposed along a second coordinate axis. The first coordinate axis and the second coordinate axis are on a same plane, and an included angle between the first coordinate axis and the second coordinate axis is 90 degrees. Each actuator in the actuator set includes a fastened end and a movable end. The fastened end of each actuator in the actuator set is connected to the base, and the movable end of each actuator in the actuator set moves close to or away from the base, to drive the carrier to move, and drive the image sensor to move.

In this embodiment of this application, the image sensor may move on the plane on which the image sensor is located, to implement anti-shake compensation. Moreover, the image sensor and the carrier are disposed in the cavity of the base, and the depth of the cavity is greater than or equal to the thickness of the image sensor. Therefore, the height of the imaging surface of the image sensor is not raised, so that the imaging apparatus can be made thinner on the basis of having an anti-shake function.

It should be noted that, the image sensor in this embodiment of this application not only can move along the first coordinate axis or the second coordinate axis on the plane on which the image sensor is located, but also needs to be enabled to rotate on the plane on which the image sensor is located. Therefore, the actuator set needs to include at least four actuators. Each actuator can implement bidirectional translation along an axial direction in which the actuator is located.

The following separately describes possible movement manners of the image sensor in this embodiment of this application.

Referring to FIG. 5, in a possible implementation, the imaging apparatus further includes a cantilever beam set. Each actuator is connected to the carrier by using a cantilever beam corresponding to the actuator. To be specific, one end of the cantilever beam is connected to the movable end of the actuator, and the other end of the cantilever beam is connected to the carrier. Specifically, the cantilever beam set includes at least a first cantilever beam 4071, a second cantilever beam 4072, a third cantilever beam 4073, and a fourth cantilever beam 4074. The first cantilever beam and the second cantilever beam are disposed along the first coordinate axis. The third cantilever beam and the fourth cantilever beam are disposed along the second coordinate axis. A movable end of the first actuator is connected to the carrier by using the first cantilever beam. A movable end of the second actuator is connected to the carrier by using the second cantilever beam. A movable end of the third actuator is connected to the carrier by using the third cantilever beam. A movable end of the fourth actuator is connected to the carrier by using the fourth cantilever beam. It can be understood that, the cantilever beam in this embodiment of this application may generate a specific amount of deformation on a plane parallel to the image sensor.

In a possible implementation, the fastened end and the movable end of each actuator in the actuator set are both of an electrostatic comb-type structure. The actuator of the electrostatic comb-type structure is usually manufactured by using a micro-electro-mechanical system (MEMS) technology. Electric potentials of the movable end and the fastened end of the actuator may be changed, to further change an attractive force between the movable end and the fastened end of the actuator, so that the actuator pushes or pulls the carrier, the carrier drives the image sensor to move along the first coordinate axis or the second coordinate axis on a plane on which the image sensor is located, or the carrier drives the image sensor to rotate on the plane on which the image sensor is located. The following separately describes the foregoing three movement manners of the image sensor.

Figure 6A:
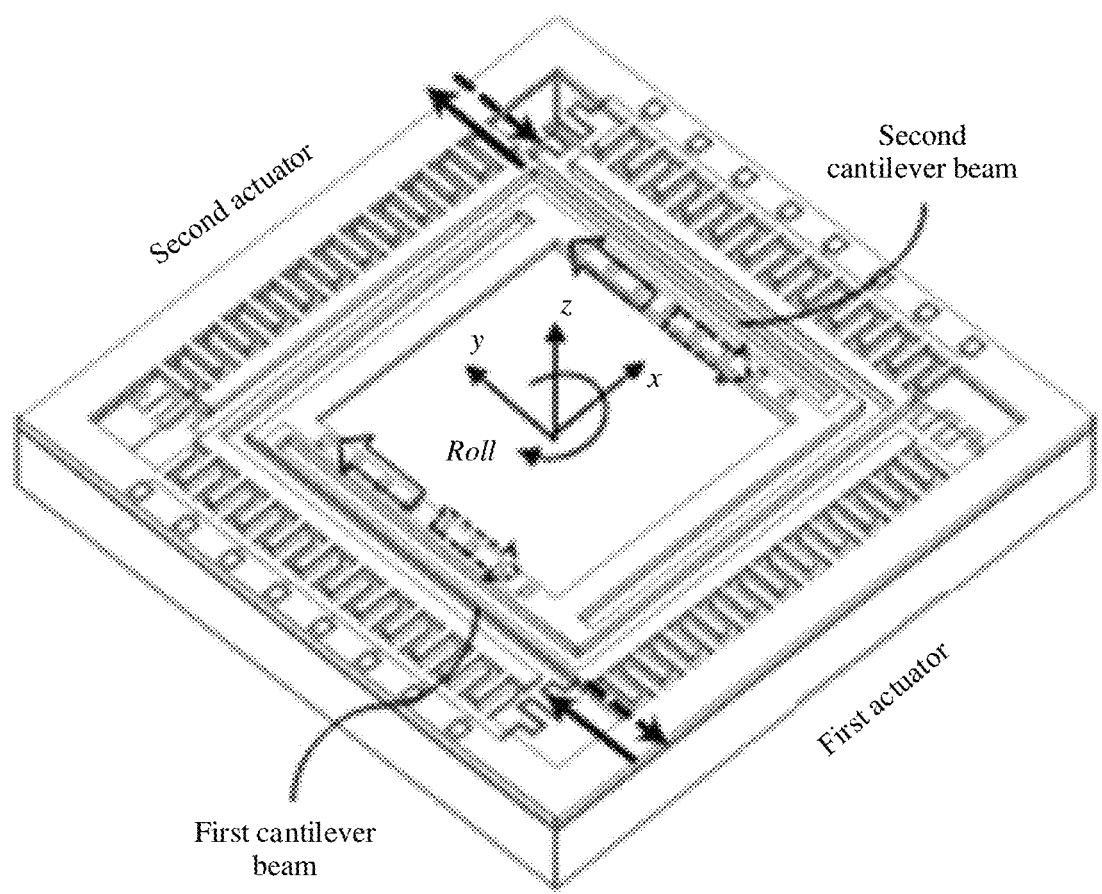
FIG. 6(a) is a schematic diagram of movement of an image sensor along a first coordinate axis.

FIG. 6(a) is a schematic diagram of movement of an image sensor along a first coordinate axis. The first actuator and the second actuator move along the first coordinate axis toward a same direction, to drive the carrier and the image sensor to move along a direction of the first coordinate axis. For example, the first actuator pushes the carrier and the second actuator pulls the carrier, to drive the image sensor to move toward a forward direction of the first coordinate axis, or the first actuator pulls the carrier and the second actuator pushes the carrier, to drive the image sensor to move toward an opposite direction of the first coordinate axis.

Figure 6B:
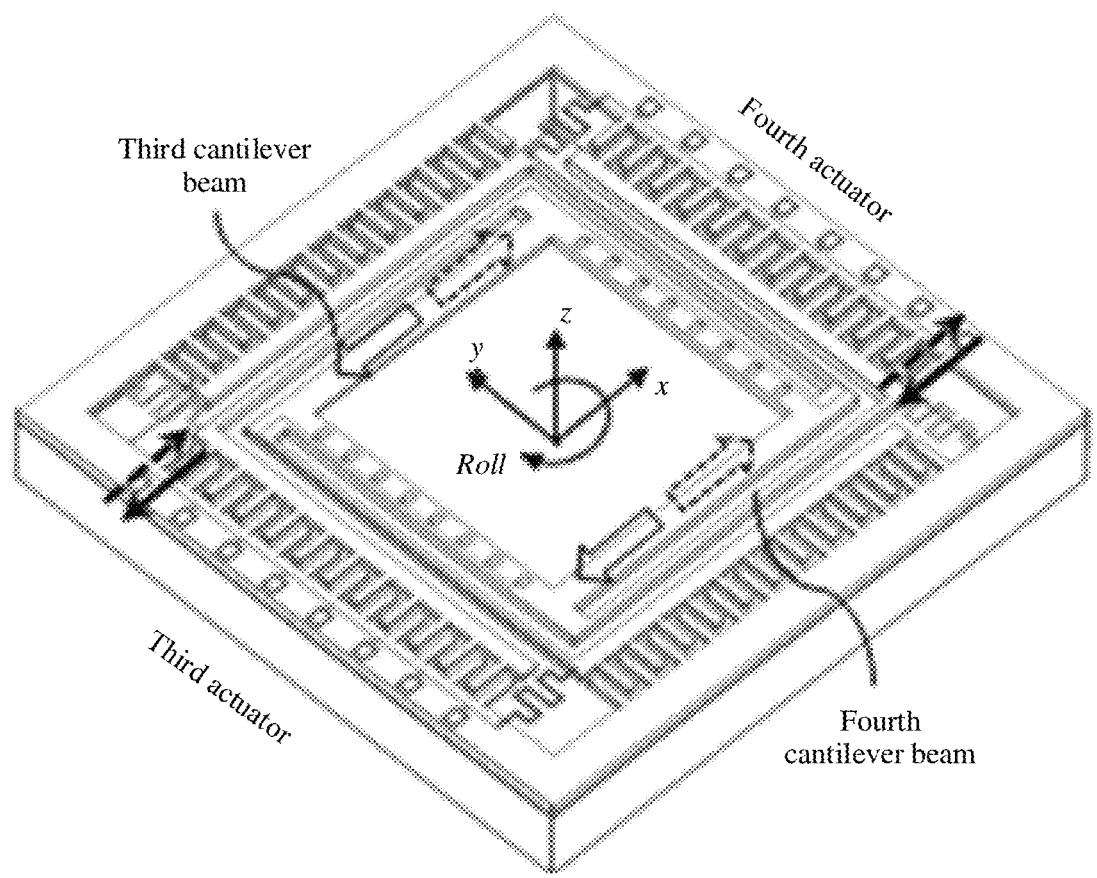
FIG. 6(b) is a schematic diagram of movement of an image sensor along a second coordinate axis.

FIG. 6(b) is a schematic diagram of movement of an image sensor along a second coordinate axis. The third actuator and the fourth actuator move along the second coordinate axis toward a same direction, to drive the carrier and the image sensor to move along a direction of the second coordinate axis. For example, the third actuator pushes the carrier and the fourth actuator pulls the carrier, to drive the image sensor to move toward a forward direction of the second coordinate axis, or the third actuator pulls the carrier and the fourth actuator pushes the carrier, to drive the image sensor to move toward an opposite direction of the second coordinate axis.

Figure 6C:
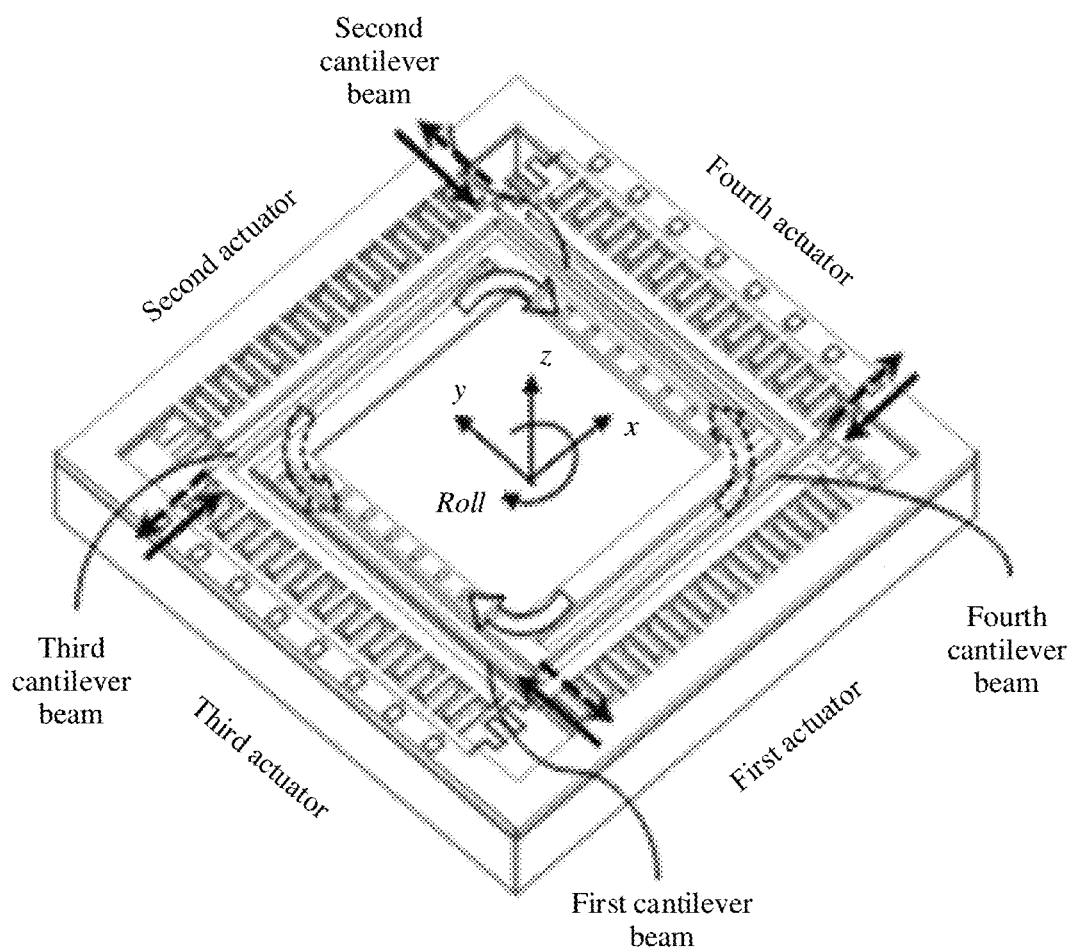
FIG. 6(c) is a schematic diagram of rotation of an image sensor on a plane on which the image sensor is located.

FIG. 6(c) is a schematic diagram of rotation of an image sensor on a plane on which the image sensor is located. The first actuator and the second actuator move along the first coordinate axis toward opposite directions, or the third actuator and the fourth actuator move along the second coordinate axis toward opposite directions, or when the first actuator and the second actuator move along the first coordinate axis toward opposite directions, the third actuator and the fourth actuator move along the second coordinate axis toward opposite directions, to drive the carrier and the image sensor to rotate on planes on which the carrier and the image sensor are located. For example, the first actuator and the second actuator both move away from the base and/or the third actuator and the fourth actuator both move away from the base, to drive the carrier and the image sensor to respectively rotate along a clockwise direction on corresponding planes, or the first actuator and the second actuator both move close to the base and/or the third actuator and the fourth actuator both move close to the base, to drive the carrier and the image sensor to respectively rotate along an anticlockwise direction on corresponding planes.

It should be noted that, in a possible implementation, the clockwise and anticlockwise directions described above may also be exchanged. To be specific, the first actuator and the second actuator both move away from the base and/or the third actuator and the fourth actuator both move away from the base, to drive the carrier and the image sensor to respectively rotate along an anticlockwise direction on corresponding planes, or the first actuator and the second actuator both move close to the base and/or the third actuator and the fourth actuator both move close to the base, to drive the carrier and the image sensor to respectively rotate along a clockwise direction on corresponding planes.

In this embodiment of this application, the image sensor not only can move along the first coordinate axis or the second coordinate axis on the plane on which the image sensor is located, but also can rotate on the plane on which the image sensor is located, to implement anti-shake functions in various directions, thereby improving user experience.

To lead out a signal of the image sensor to the base, the carrier needs to implement an electrical connection to the image sensor and the base separately. Therefore, this embodiment of this application provides a plurality of different implementations of the electrical connection. The following separately describes the implementations.

Figure 7:
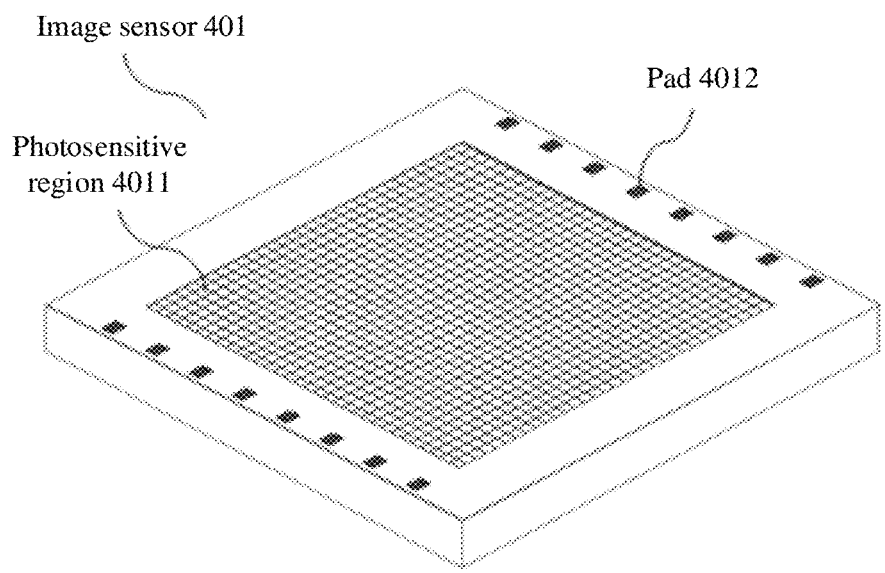
FIG. 7 is a schematic diagram of a three-dimensional structure of an image sensor.

The electrical connection between the carrier and the image sensor is described first. FIG. 7 is a schematic diagram of a three-dimensional structure of an image sensor. In addition to the photosensitive region 4011, the image sensor 401 further includes a pad 4012 disposed on the top surface of the image sensor. A quantity of pads is greater than or equal to 1. It can be understood that the pad is located around the photosensitive region, and does not overlap the photosensitive region.

In addition, a first top-side pad 4041 is further disposed on a top surface of the carrier 404, and the first top-side pad is electrically connected to the pad of the image sensor. Specifically, there may be two different implementations, which are separately described below.

Figure 8:
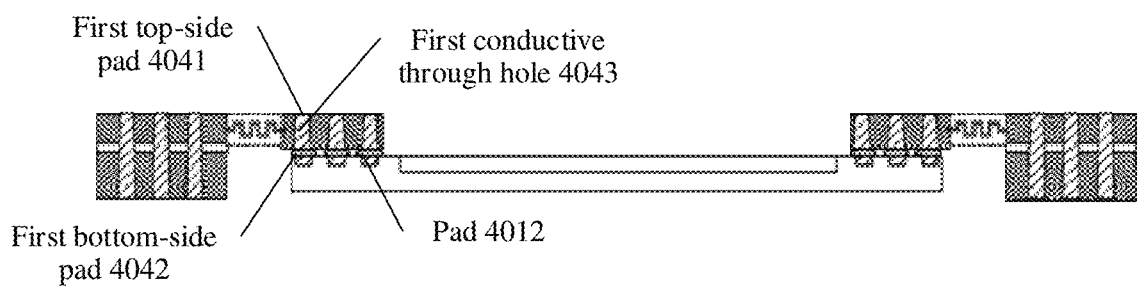
FIG. 8 is a schematic diagram of implementing an electrical connection between a carrier and an image sensor.

A first implementation is shown in FIG. 8. The carrier 404 further includes a first conductive through hole 4043 and a first bottom-side pad 4042 disposed on a bottom surface of the carrier. The first conductive through hole is used for connecting the first top-side pad to the first bottom-side pad. The first bottom-side pad and the pad of the image sensor are soldered together. Because an electrical connection between the first top-side pad and the first bottom-side pad is implemented by using the first conductive through hole, the electrical connection between the first top-side pad and the image sensor can be implemented. It should be noted that, a quantity of first top-side pads, a quantity of first conductive through holes, and a quantity of first bottom-side pads are all greater than or equal to 1, and the first top-side pad, the first conductive through hole, the first bottom-side pad, and the pad on the image sensor may be in a one-to-one correspondence with each other.

Figure 9:
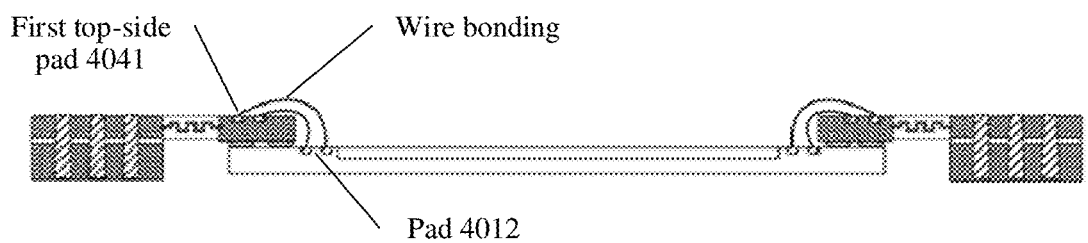
FIG. 9 is another schematic diagram of implementing an electrical connection between a carrier and an image sensor.

A second implementation is shown in FIG. 9. The first top-side pad on the carrier is electrically connected to the pad on the image sensor through wire bonding, and the bottom surface of the carrier may be bonded to the top surface of the image sensor, to fasten the image sensor.

In this embodiment of this application, different manners are provided, to implement the electrical connection between the carrier and the image sensor, thereby improving practicability and flexibility of this application. In addition, compared with the second implementation, in the first implementation, a wire bonding operation between the carrier and the image sensor does not need to be performed, to avoid impact of a wire bonding process on devices, thereby reducing a possibility of damaging the devices.

The electrical connection between the carrier and the base is described below. Referring to FIG. 5, the base further includes a second top-side pad 4031 disposed on a top surface of the base. The first top-side pad 4041 of the carrier may be electrically connected to the second top-side pad 4031 of the base by using the flexible connection member. A quantity of second top-side pads is greater than or equal to 1, and the first top-side pad may be in a one-to-one correspondence with the second top-side pad. Specifically, a wire led out of the first top-side pad may be electrically connected to the second top-side pad along the flexible connection member. It can be understood that, if there are a plurality of flexible connection members, preferably, the first top-side pad 4041 may be electrically connected to the second top-side pad 4031 along a flexible connection member closest to the first top-side pad 4041. Certainly, in addition, the first top-side pad 4041 may be electrically connected to the second top-side pad 4031 along another flexible connection member. This is not specifically limited herein.

It should be noted that, in a possible implementation, the flexible connection member provides support for the carrier, and in addition, the movable end of the actuator may be connected to the carrier by using a cantilever beam. Therefore, the movable end of the actuator, the cantilever beam, and the carrier may be considered as an integral structure. Therefore, one end of the flexible connection member is connected to the base, and the other end of the flexible connection member may be connected to the carrier, the movable end of the actuator, or the cantilever beam. This is not specifically limited herein.

In a possible implementation, the imaging apparatus further includes a printed circuit board (PCB). The PCB is fastened to a bottom surface of the base. After being led out to the base, the signal of the image sensor needs to be further led out to the PCB. Therefore, an electrical connection between the base and the PCB also needs to be implemented. There may be two different implementations herein, which are separately described below.

Figure 10:
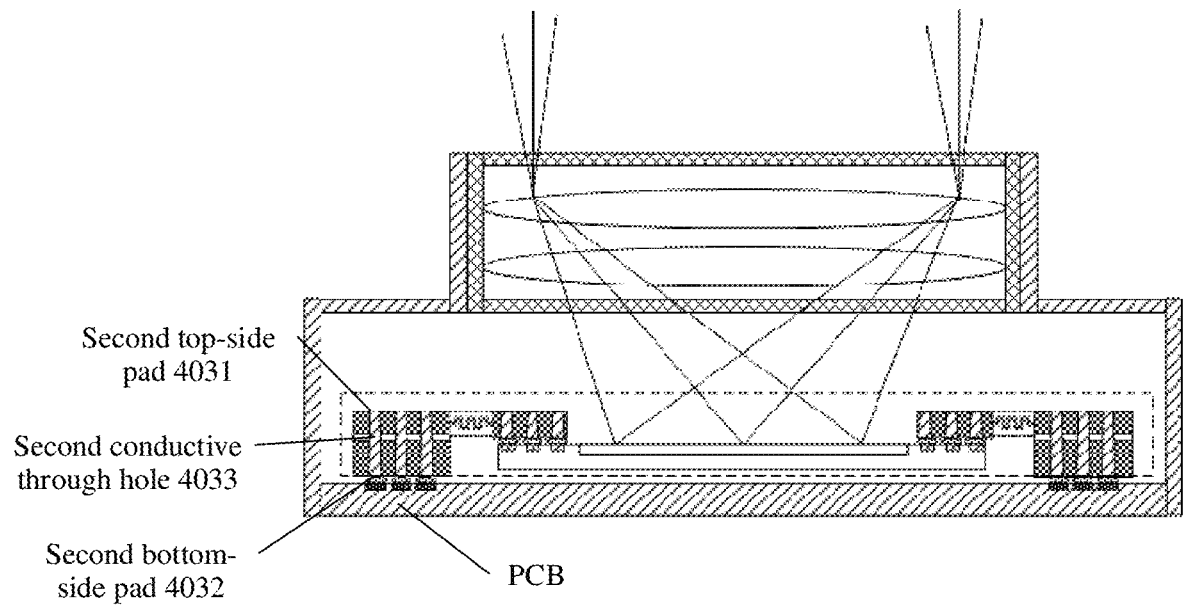
FIG. 10 is a schematic diagram of implementing an electrical connection between a base and a PCB.

A first implementation is shown in FIG. 10. The base further includes a second bottom-side pad 4032 and a second conductive through hole 4033 that are provided on the bottom surface of the base. The second conductive through hole is used for connecting the second top-side pad to the second bottom-side pad. The second bottom-side pad and the PCB are soldered together. Because an electrical connection between the second top-side pad and the second bottom-side pad is implemented by using the second conductive through hole, the electrical connection between the second top-side pad and the PCB can be implemented. It should be noted that, a quantity of second top-side pads, a quantity of second conductive through holes, and a quantity of second bottom-side pads are all greater than or equal to 1, and the second top-side pad, the second conductive through hole, and the second bottom-side pad may be in a one-to-one correspondence with each other.

Figure 11:
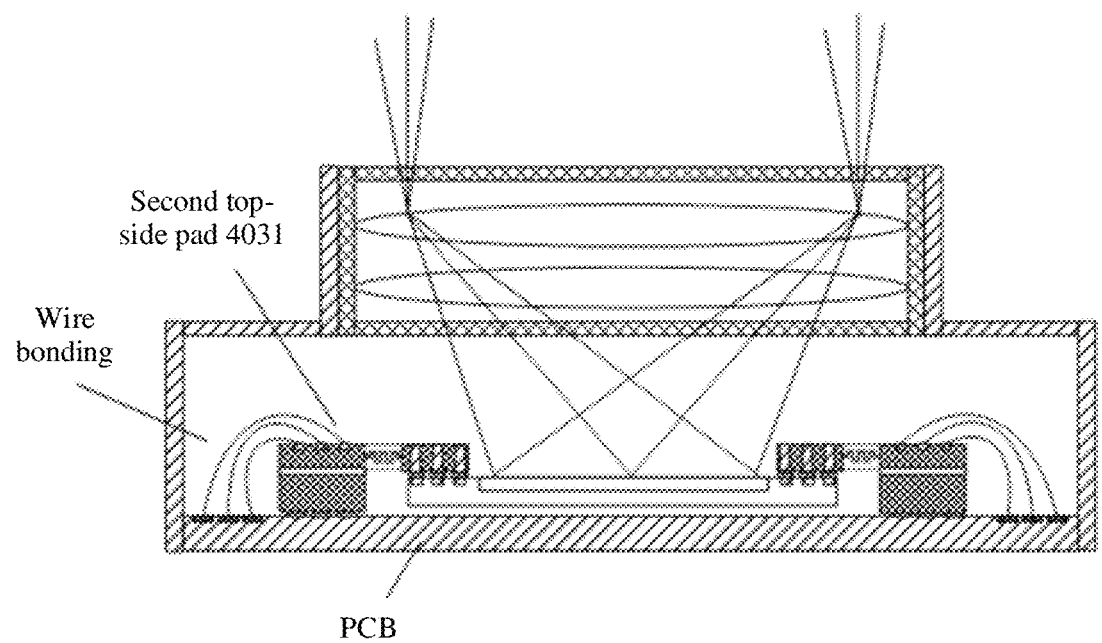
FIG. 11 is another schematic diagram of implementing an electrical connection between a base and a PCB.

A second implementation is shown in FIG. 11. The second top-side pad on the base is electrically connected to the PCB through wire bonding.

In this embodiment of this application, different manners are provided, to implement the electrical connection between the base and the PCB, thereby improving practicability and flexibility of this application. In addition, compared with the second implementation, in the first implementation, a wire bonding operation between the base and the PCB does not need to be performed, to avoid impact of a wire bonding process on devices, thereby reducing a possibility of damaging the devices.

The imaging apparatus provided in the embodiments of this application may be a component of a terminal device. The following uses an example in which the terminal device is a mobile phone for description.

Figure 12:
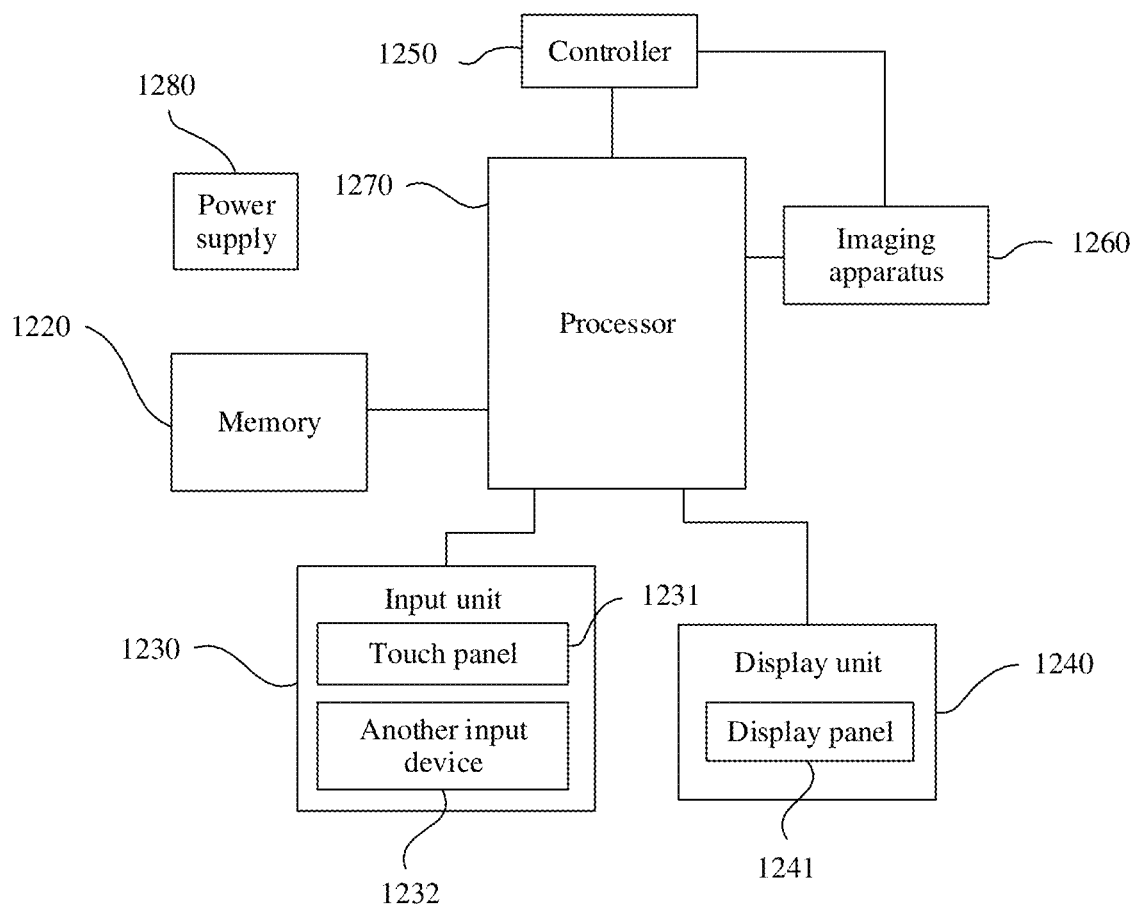
FIG. 12 is a schematic structural diagram of a terminal device according to this application.

FIG. 12 is a block diagram of a partial structure of a mobile phone related to an imaging apparatus according to an embodiment of this application. Referring to FIG. 12, the mobile phone includes components such as a memory 1220, an input unit 1230, a display unit 1240, a controller 1250, an imaging apparatus 1260, a processor 1270, and a power supply 1280. A person skilled in the art may understand that, the structure of the mobile phone shown in FIG. 12 does not constitute a limitation on the mobile phone. The mobile phone may include more or fewer components than those shown in the figure, or combine some components, or have different component arrangements.

The following describes each component of the mobile phone in detail with reference to FIG. 12.

The memory 1220 may be configured to store a software program and a module. The processor 1270 runs the software program and the module that are stored in the memory 1220, to implement various function applications and data processing of the mobile phone. The memory 1220 may mainly include a program storage area and a data storage area. The program storage area may store an operating system, an application required by at least one function (such as a sound play function and an image play function) and the like. The data storage area may store data (such as audio data and a phone book) created based on use of the mobile phone, and the like. In addition, the memory 1220 may include a high-speed random access memory, and may further include a non-volatile memory, such as at least one magnetic disk storage device, a flash storage device, or another volatile solid-state storage device.

The input unit 1230 may be configured to receive input digit or character information and generate key signal input related to user settings and function control of the mobile phone. Specifically, the input unit 1230 may include a touch panel 1231 and another input device 1232. The touch panel 1231, also referred to as a touchscreen, may collect a touch operation performed by a user on or near the touch panel 1231 (for example, an operation performed by the user on or near the touch panel 1231 by using any proper object or accessory such as a finger or a stylus), and drive a corresponding connection apparatus based on a preset program. Optionally, the touch panel 1231 may include two parts: a touch detection apparatus and a touch controller. The touch detection apparatus detects a touch position of the user, detects a signal generated by the touch operation, and transmits the signal to the touch controller. The touch controller receives touch information from the touch detection apparatus, converts the touch information into coordinates of a touch point, and then sends the coordinates of the touch point to the processor 1270. The touch controller can receive and execute a command sent by the processor 1270. In addition, the touch panel 1231 may be implemented in a plurality of types, such as a resistive type, a capacitive type, an infrared type, and a surface acoustic wave type. In addition to the touch panel 1231, the input unit 1230 may further include the another input device 1232. Specifically, the another input device 1232 may include but is not limited to one or more of a physical keyboard, a function key (for example, a volume control key or an on/off key), a trackball, a mouse, a joystick, and the like.

The display unit 1240 may be configured to display information entered by the user or information provided for the user, and various menus of the mobile phone. In the embodiments of this application, the display unit 1240 is mainly configured to display an image obtained through photographing. The display unit 1240 may include a display panel 1241. Optionally, the display panel 1241 may be configured in a form of a liquid crystal display (LCD), an organic light-emitting diode (OLED), or the like. Further, the touch panel 1231 may cover the display panel 1241. After detecting the touch operation on or near the touch panel 1231, the touch panel 1231 transfers the touch operation to the processor 1270 to determine a type of a touch event. Subsequently, the processor 1270 provides corresponding visual output on the display panel 1241 based on the type of the touch event. In FIG. 12, the touch panel 1231 and the display panel 1241 serve as two independent components to implement input and output functions of the mobile phone. However, in some embodiments, the touch panel 1231 and the display panel 1241 may be integrated to implement the input and output functions of the mobile phone.

The controller 1250 may be configured to control an actuator of the imaging apparatus to move, to drive a carrier and an image sensor to move, so as to implement a stabilization function of the imaging apparatus.

The imaging apparatus 1260 may be the imaging apparatus described in any one of the embodiments corresponding to FIG. 3 to FIG. 12.

The processor 1270 is a control center of the mobile phone, and is connected to various parts of the entire mobile phone through various interfaces and lines. The processor 1270 performs various functions and data processing of the mobile phone by running or executing the software program and/or the module stored in the memory 1220 and invoking data stored in the memory 1220, to perform overall monitoring on the mobile phone. In this embodiment of this application, the processor is mainly configured to invoke a program and an instruction stored in the memory, and control the imaging apparatus by using the controller. Optionally, the processor 1270 may include one or more processing units. Preferably, the processor 1270 may integrate an application processor and a modem processor. The application processor mainly processes an operating system, a user interface, an application program, and the like. The modem processor mainly processes wireless communication. It may be understood that, alternatively, the modem processor may not be integrated into the processor 1270. In the embodiments of this application, the processor 1270 may further perform processing such as denoising, enhancement, and partitioning and blurring on an image based on an obtained signal of the image sensor.

The mobile phone further includes the power supply 1280 (for example, a battery) that supplies power to each component. Preferably, the power supply may be logically connected to the processor 1270 through a power management system, to implement functions such as charging management, discharging management, and power consumption management through the power management system.

It should be noted that the foregoing embodiments are merely used to describe the technical solutions of this application, but are not intended to limit this application. Although this application is described in detail with reference to the foregoing embodiments, persons of ordinary skill in the art should understand that they may still make modifications to the technical solutions recorded in the foregoing embodiments or make equivalent replacements to some technical features thereof, without departing from the spirit and scope of the technical solutions of the embodiments of this application.

What is claimed is:

1. An imaging apparatus, comprising an image sensor and an anti-shake module, wherein the image sensor comprises a photosensitive region, the photosensitive region is disposed on a top surface of the image sensor, and the anti-shake module comprises a base, a carrier, at least one flexible connection member, and an actuator set;
   the base comprises a cavity, a depth of the cavity is greater than or equal to a thickness of the image sensor, the carrier is disposed in the cavity, and the base provides support for the carrier by using the flexible connection member;
   the carrier comprises a through hole, a size of the through hole is greater than or equal to that of the photosensitive region, the carrier is separately electrically connected to the image sensor and the base, a bottom surface of the carrier is fastened to the top surface of the image sensor, and the image sensor is disposed in the cavity;
   the actuator set comprises at least a first actuator, a second actuator, a third actuator, and a fourth actuator, the first actuator and the second actuator are disposed along a first coordinate axis, the third actuator and the fourth actuator are disposed along a second coordinate axis, the first coordinate axis and the second coordinate axis are on a same plane, an included angle between the first coordinate axis and the second coordinate axis is 90 degrees, and each actuator in the actuator set comprises a fastened end and a movable end; and
   the fastened end of each actuator in the actuator set is connected to the base, and the movable end of each actuator in the actuator set moves close to or away from the base, to drive the carrier to move, and drive the image sensor to move.

2. The imaging apparatus according to claim 1, wherein the image sensor further comprises at least one pad, and the pad is disposed on the top surface of the image sensor; and
   the carrier further comprises at least one first top-side pad, the first top-side pad is disposed on a top surface of the carrier, and the first top-side pad is electrically connected to the pad.

3. The imaging apparatus according to claim 2, wherein the carrier further comprises at least one first conductive through hole and at least one first bottom-side pad, the first bottom-side pad is disposed on the bottom surface of the carrier, the first conductive through hole is used for connecting the first top-side pad to the first bottom-side pad, and the first bottom-side pad and the pad are soldered together.

4. The imaging apparatus according to claim 2, wherein the first top-side pad is electrically connected to the pad through wire bonding, and the bottom surface of the carrier is bonded to the top surface of the image sensor.

5. The imaging apparatus according to claim 2, wherein the base further comprises at least one second top-side pad, the second top-side pad is disposed on a top surface of the base, and the first top-side pad is electrically connected to the second top-side pad by using the flexible connection member.

6. The imaging apparatus according to claim 5, wherein the imaging apparatus further comprises a printed circuit board (PCB), the PCB is fastened to a bottom surface of the base, the base further comprises at least one conductive through hole and at least one bottom-side pad, the bottom-side pad is disposed on the bottom surface of the base, the conductive through hole is used for connecting the second top-side pad to the bottom-side pad, and the bottom-side pad and the PCB are soldered together.

7. The imaging apparatus according to claim 5, wherein the imaging apparatus further comprises a printed circuit board (PCB), the PCB is fastened to a bottom surface of the base, and the second top-side pad is electrically connected to the PCB through wire bonding.

8. The imaging apparatus according to claim 1, wherein the imaging apparatus further comprises a cantilever beam set, the cantilever beam set comprises at least a first cantilever beam, a second cantilever beam, a third cantilever beam, and a fourth cantilever beam, the first cantilever beam and the second cantilever beam are disposed along the first coordinate axis, the third cantilever beam and the fourth cantilever beam are disposed along the second coordinate axis, a movable end of the first actuator is connected to the carrier by using the first cantilever beam, a movable end of the second actuator is connected to the carrier by using the second cantilever beam, a movable end of the third actuator is connected to the carrier by using the third cantilever beam, and a movable end of the fourth actuator is connected to the carrier by using the fourth cantilever beam.

9. The imaging apparatus according to claim 1, wherein the fastened end and the movable end of each actuator in the actuator set are both of an electrostatic comb-type structure.

10. The imaging apparatus according to claim 9, wherein the first actuator and the second actuator move toward a same direction, and drive the carrier and the image sensor to move along the first coordinate axis.

11. The imaging apparatus according to claim 9, wherein the third actuator and the fourth actuator move toward a same direction, and drive the carrier and the image sensor to move along the second coordinate axis.

12. The imaging apparatus according to claim 9, wherein the first actuator and the second actuator move toward opposite directions, and/or the third actuator and the fourth actuator move toward opposite directions, and drive the carrier and the image sensor to respectively rotate on corresponding planes.

13. A terminal device, comprising a processor, a controller, a non-transitory computer readable storage memory, a bus, and an imaging apparatus, wherein the processor, the controller, the memory, and the imaging apparatus are connected to each other by using the bus, the memory is configured to store a program and an instruction, the processor is configured to invoke the program and the instruction stored in the memory, and the processor is further configured to control the imaging apparatus by using the controller;
the imaging apparatus comprises an image sensor and an anti-shake module, the image sensor comprises a photosensitive region, the photosensitive region is disposed on a top surface of the image sensor, and the anti-shake module comprises a base, a carrier, at least one flexible connection member, and an actuator set;
the base comprises a cavity, a depth of the cavity is greater than or equal to a thickness of the image sensor, the carrier is disposed in the cavity, and the base provides support for the carrier by using the flexible connection member;
the carrier comprises a through hole, a size of the through hole is greater than or equal to that of the photosensitive region, the carrier is separately electrically connected to the image sensor and the base, a bottom surface of the carrier is fastened to the top surface of the image sensor, and the image sensor is disposed in the cavity;
the actuator set comprises at least a first actuator, a second actuator, a third actuator, and a fourth actuator, the first actuator and the second actuator are disposed along a first coordinate axis, the third actuator and the fourth actuator are disposed along a second coordinate axis, the first coordinate axis and the second coordinate axis are on a same plane, an included angle between the first coordinate axis and the second coordinate axis is 90 degrees, and each actuator in the actuator set comprises a fastened end and a movable end; and
the fastened end of each actuator in the actuator set is connected to the base, and the movable end of each actuator in the actuator set moves close to or away from the base, to drive the carrier to move, and drive the image sensor to move.

14. The terminal device according to claim 13, wherein the image sensor further comprises at least one pad, and the pad is disposed on the top surface of the image sensor; and
the carrier further comprises a first top-side pad, the first top-side pad is disposed on a top surface of the carrier, and the first top-side pad is electrically connected to the pad.

15. The terminal device according to claim 14, wherein the carrier further comprises at least one first conductive through hole and at least one first bottom-side pad, the first bottom-side pad is disposed on the bottom surface of the carrier, the first conductive through hole is used for connecting the first top-side pad to the first bottom-side pad, and the first bottom-side pad and the pad are soldered together.

16. The terminal device according to claim 14, wherein the first top-side pad is electrically connected to the pad through wire bonding, and the bottom surface of the carrier is bonded to the top surface of the image sensor.

17. The terminal device according to claim 14, wherein the base further comprises at least one second top-side pad, the second top-side pad is disposed on a top surface of the base, and the first top-side pad is electrically connected to the second top-side pad by using the flexible connection member.

18. The terminal device according to claim 17, wherein the imaging apparatus further comprises a printed circuit board (PCB), the PCB is fastened to a bottom surface of the base, the base further comprises at least one conductive through hole and at least one bottom-side pad, the bottom-side pad is disposed on the bottom surface of the base, the conductive through hole is used for connecting the second top-side pad to the bottom-side pad, and the bottom-side pad and the PCB are soldered together.

19. The terminal device according to claim 17, wherein the imaging apparatus further comprises a printed circuit board (PCB), the PCB is fastened to a bottom surface of the base, and the second top-side pad is electrically connected to the PCB through wire bonding.

20. The terminal device according to claim 13, wherein the imaging apparatus further comprises a cantilever beam set, the cantilever beam set comprises at least a first cantilever beam, a second cantilever beam, a third cantilever beam, and a fourth cantilever beam, the first cantilever beam and the second cantilever beam are disposed along the first coordinate axis, the third cantilever beam and the fourth cantilever beam are disposed along the second coordinate axis, a movable end of the first actuator is connected to the carrier by using the first cantilever beam, a movable end of the second actuator is connected to the carrier by using the second cantilever beam, a movable end of the third actuator is connected to the carrier by using the third cantilever beam, and a movable end of the fourth actuator is connected to the carrier by using the fourth cantilever beam.

* * * * *